(12) United States Patent
Kister et al.

(10) Patent No.: US 9,310,428 B2
(45) Date of Patent: Apr. 12, 2016

(54) PROBE RETENTION ARRANGEMENT

(71) Applicant: FormFactor, Inc., Livermore, CA (US)

(72) Inventors: January Kister, Portola Valley, CA (US); Alex Shtarker, San Jose, CA (US)

(73) Assignee: FORMFACTOR, INC., Livermore, CA (US)

(*) Notice: Subject to any disclaimer, the term of this patent is extended or adjusted under 35 U.S.C. 154(b) by 0 days.

(21) Appl. No.: 14/564,991

(22) Filed: Dec. 9, 2014

(65) Prior Publication Data

US 2015/0091596 A1    Apr. 2, 2015

Related U.S. Application Data

(60) Division of application No. 12/871,420, filed on Aug. 30, 2010, now Pat. No. 8,907,689, which is a continuation-in-part of application No. 11/580,204, filed on Oct. 11, 2006, now Pat. No. 7,786,740.

(51) Int. Cl.
| | |
|---|---|
| *G01R 31/20* | (2006.01) |
| *G01R 31/28* | (2006.01) |
| *G01R 1/073* | (2006.01) |
| *G01R 1/04* | (2006.01) |
| *G01R 3/00* | (2006.01) |

(52) U.S. Cl.
CPC .......... *G01R 31/2887* (2013.01); *G01R 1/0408* (2013.01); *G01R 1/07314* (2013.01); *G01R 1/07342* (2013.01); *G01R 1/07371* (2013.01); *G01R 1/07357* (2013.01); *G01R 3/00* (2013.01); *Y10T 29/49826* (2015.01)

(58) Field of Classification Search
CPC .......... G01R 1/07378; G01R 31/2889; G01R 1/06711; G01R 1/07307; G01R 31/2886
See application file for complete search history.

(56) References Cited

U.S. PATENT DOCUMENTS

| | | |
|---|---|---|
| 2,754,203 A | 7/1956 | Vordahl |
| 3,518,612 A | 6/1970 | Dunman et al. |
| 3,599,093 A | 8/1971 | Oates |
| 3,710,251 A | 1/1973 | Hagge et al. |
| 3,812,311 A | 5/1974 | Kvaternik |
| 4,027,935 A | 6/1977 | Byrnes et al. |
| 4,115,736 A | 9/1978 | Tracy |
| 4,116,523 A | 9/1978 | Coberly et al. |
| 4,314,855 A | 2/1982 | Chang et al. |
| 4,423,376 A | 12/1983 | Byrnes et al. |
| 4,525,697 A | 6/1985 | Jones et al. |

(Continued)

FOREIGN PATENT DOCUMENTS

| | | |
|---|---|---|
| DE | 4237591 | 5/1994 |
| EP | 0144682 | 6/1985 |

(Continued)

OTHER PUBLICATIONS

Levy, "Wafer Probe TM System", Southwest Test Workshop, Jun. 1997, 1-19.

(Continued)

*Primary Examiner* — Tung X Nguyen
(74) *Attorney, Agent, or Firm* — Peacock Myers, P.C.; Deborah A. Peacock; Philip D. Askenazy

(57) ABSTRACT

A retention arrangement that includes one or more templates for securing and aligning probes for testing a device under test.

8 Claims, 10 Drawing Sheets

(56) References Cited

U.S. PATENT DOCUMENTS

| | | |
|---|---|---|
| 4,532,423 A | 7/1985 | Tojo et al. |
| 4,567,433 A | 1/1986 | Ohkubo et al. |
| 4,593,961 A | 6/1986 | Cosmo |
| 4,618,767 A | 10/1986 | Smith et al. |
| 4,618,821 A | 10/1986 | Lenz |
| 4,706,019 A | 11/1987 | Richardson |
| 4,730,158 A | 3/1988 | Kasai et al. |
| 4,747,698 A | 5/1988 | Wickramasinghe et al. |
| 4,757,255 A | 7/1988 | Margozzi |
| 4,772,846 A | 9/1988 | Reeds |
| 4,773,877 A | 9/1988 | Kruger et al. |
| 4,807,159 A | 2/1989 | Komatsu et al. |
| 4,871,964 A | 10/1989 | Boll et al. |
| 4,901,013 A | 2/1990 | Benedetto et al. |
| 4,967,148 A | 10/1990 | Doemens et al. |
| 4,973,903 A | 11/1990 | Schemmel |
| 5,015,947 A | 5/1991 | Chism |
| 5,026,291 A | 6/1991 | David |
| 5,030,318 A | 7/1991 | Reche |
| 5,061,192 A | 10/1991 | Chapin et al. |
| 5,067,007 A | 11/1991 | Otsuka et al. |
| 5,145,384 A | 9/1992 | Asakawa et al. |
| 5,205,739 A | 4/1993 | Malo et al. |
| 5,207,585 A | 5/1993 | Byrnes |
| 5,225,771 A | 7/1993 | Leedy |
| 5,230,632 A | 7/1993 | Baumberger et al. |
| 5,237,743 A | 8/1993 | Busacco et al. |
| 5,354,205 A | 10/1994 | Feigenbaum et al. |
| 5,399,982 A | 3/1995 | Driller |
| 5,422,574 A | 6/1995 | Kister |
| 5,430,614 A | 7/1995 | Difrancesco |
| 5,436,571 A | 7/1995 | Karasawa |
| 5,468,994 A | 11/1995 | Pendse |
| 5,476,211 A | 12/1995 | Khandros |
| 5,531,022 A | 7/1996 | Beaman et al. |
| 5,576,631 A | 11/1996 | Stowers et al. |
| 5,632,631 A | 5/1997 | Fjelstad et al. |
| 5,635,846 A | 6/1997 | Beaman et al. |
| 5,642,056 A | 6/1997 | Nakajima et al. |
| 5,644,249 A | 7/1997 | Kister |
| 5,676,599 A | 10/1997 | Ricks et al. |
| 5,701,085 A | 12/1997 | Malladi |
| 5,720,098 A | 2/1998 | Kister |
| 5,742,174 A | 4/1998 | Kister et al. |
| 5,751,157 A | 5/1998 | Kister |
| 5,764,070 A | 6/1998 | Pedder |
| 5,764,072 A | 6/1998 | Kister |
| 5,764,409 A | 6/1998 | Colvin |
| 5,767,691 A | 6/1998 | Verkuil |
| 5,772,451 A | 6/1998 | Dozier, II et al. |
| 5,773,987 A | 6/1998 | Montoya |
| 5,802,699 A | 9/1998 | Fjelstad et al. |
| 5,806,181 A | 9/1998 | Khandros et al. |
| 5,821,763 A | 10/1998 | Beaman et al. |
| 5,829,128 A | 11/1998 | Eldridge et al. |
| 5,832,601 A | 11/1998 | Eldridge et al. |
| 5,834,946 A | 11/1998 | Albrow et al. |
| 5,847,936 A | 12/1998 | Forehand |
| 5,852,871 A | 12/1998 | Khandros |
| 5,864,946 A | 2/1999 | Eldridge et al. |
| 5,884,395 A | 3/1999 | Dabrowiecki et al. |
| 5,892,539 A | 4/1999 | Colvin |
| 5,914,613 A | 6/1999 | Gleason et al. |
| 5,917,707 A | 6/1999 | Khandros et al. |
| 5,923,178 A | 7/1999 | Higgins et al. |
| 5,926,951 A | 7/1999 | Khandros et al. |
| 5,932,323 A | 8/1999 | Throssel |
| 5,934,914 A | 8/1999 | Fjelstad et al. |
| 5,936,421 A | 8/1999 | Stowers et al. |
| 5,945,836 A | 8/1999 | Sayre et al. |
| 5,952,843 A | 9/1999 | Vinh |
| 5,969,533 A | 10/1999 | Takagi |
| 5,970,167 A | 10/1999 | Colvin |
| 5,974,662 A | 11/1999 | Eldridge et al. |
| 5,994,152 A | 11/1999 | Khandros et al. |
| 6,027,630 A | 2/2000 | Cohen |
| 6,029,344 A | 2/2000 | Khandros et al. |
| 6,031,282 A | 2/2000 | Jones et al. |
| 6,064,215 A | 5/2000 | Kister |
| 6,066,957 A | 5/2000 | Van Loan et al. |
| 6,071,630 A | 6/2000 | Tomaru et al. |
| 6,086,386 A | 7/2000 | Fjelstad et al. |
| 6,133,072 A | 10/2000 | Fjelstad |
| 6,184,576 B1 | 2/2001 | Jones et al. |
| 6,204,674 B1 | 3/2001 | Dabrowiecki et al. |
| 6,205,660 B1 | 3/2001 | Fjelstad et al. |
| 6,215,320 B1 | 4/2001 | Parrish |
| 6,218,203 B1 | 4/2001 | Khoury et al. |
| 6,246,245 B1 | 6/2001 | Akram et al. |
| 6,246,247 B1 | 6/2001 | Eldridge et al. |
| 6,247,228 B1 | 6/2001 | Distefano et al. |
| 6,255,126 B1 | 7/2001 | Mathieu et al. |
| 6,259,261 B1 | 7/2001 | Engelking et al. |
| 6,278,284 B1 | 8/2001 | Mori et al. |
| 6,292,003 B1 | 9/2001 | Fredrickson et al. |
| 6,334,247 B1 | 1/2002 | Beaman et al. |
| 6,336,269 B1 | 1/2002 | Eldridge et al. |
| 6,344,753 B1 | 2/2002 | Takada et al. |
| 6,359,452 B1 | 3/2002 | Mozzetta |
| 6,411,112 B1 | 6/2002 | Das et al. |
| 6,414,502 B1 | 7/2002 | Sayre et al. |
| 6,419,500 B1 | 7/2002 | Kister |
| 6,420,887 B1 | 7/2002 | Kister et al. |
| 6,424,164 B1 | 7/2002 | Kister |
| 6,433,571 B1 | 8/2002 | Montoya |
| 6,437,584 B1 | 8/2002 | Gleason et al. |
| 6,441,315 B1 | 8/2002 | Eldridge et al. |
| 6,443,784 B1 | 9/2002 | Kimoto |
| 6,482,013 B2 | 11/2002 | Eldridge et al. |
| 6,483,328 B1 | 11/2002 | Eldridge et al. |
| 6,486,689 B1 | 11/2002 | Nishikawa |
| 6,496,026 B1 | 12/2002 | Long et al. |
| 6,525,552 B2 | 2/2003 | Kister |
| 6,529,021 B1 | 3/2003 | Yu et al. |
| 6,530,148 B1 | 3/2003 | Kister |
| 6,538,336 B1 | 3/2003 | Secker et al. |
| 6,566,898 B2 | 5/2003 | Theissen et al. |
| 6,570,396 B1 | 5/2003 | Kister |
| 6,573,738 B1 | 6/2003 | Matsuo et al. |
| 6,575,767 B2 | 6/2003 | Satoh et al. |
| 6,576,485 B2 | 6/2003 | Zhou et al. |
| 6,586,955 B2 | 7/2003 | Fjelstad et al. |
| 6,615,485 B2 | 9/2003 | Eldridge et al. |
| 6,624,648 B2 | 9/2003 | Eldridge et al. |
| 6,633,176 B2 | 10/2003 | Takemoto et al. |
| 6,641,430 B2 | 11/2003 | Zhou et al. |
| 6,646,455 B2 | 11/2003 | Maekawa et al. |
| 6,676,438 B2 | 1/2004 | Zhou et al. |
| 6,677,245 B2 | 1/2004 | Zhou et al. |
| 6,690,185 B1 | 2/2004 | Khandros et al. |
| 6,707,311 B2 | 3/2004 | Hohenwarter |
| 6,727,719 B2 | 4/2004 | Liao et al. |
| 6,731,123 B2 | 5/2004 | Kimoto |
| 6,765,228 B2 | 7/2004 | Lin et al. |
| 6,768,331 B2 | 7/2004 | Longson et al. |
| 6,825,422 B2 | 11/2004 | Eldridge et al. |
| 6,842,023 B2 | 1/2005 | Yoshida et al. |
| 6,847,221 B2 | 1/2005 | Kimoto et al. |
| 6,853,208 B2 * | 2/2005 | Okubo et al. ............ 324/756.03 |
| 6,881,974 B2 | 4/2005 | Wood et al. |
| 6,890,185 B1 | 5/2005 | Kister et al. |
| 6,891,385 B2 | 5/2005 | Miller |
| 6,897,666 B2 | 5/2005 | Swettlen et al. |
| D507,198 S | 7/2005 | Kister |
| 6,917,102 B2 | 7/2005 | Zhou et al. |
| 6,917,525 B2 | 7/2005 | Mok et al. |
| D510,043 S | 9/2005 | Kister |
| 6,945,827 B2 | 9/2005 | Grube et al. |
| 6,956,389 B1 | 10/2005 | Mai |
| 6,965,244 B2 | 11/2005 | Miller |
| 6,965,245 B2 | 11/2005 | Kister et al. |
| 6,970,005 B2 | 11/2005 | Rincon et al. |
| 7,015,707 B2 | 3/2006 | Cherian |
| 7,036,221 B2 | 5/2006 | Higashida et al. |

(56) References Cited

U.S. PATENT DOCUMENTS

| | | |
|---|---|---|
| 7,046,021 B2 | 5/2006 | Kister |
| 7,059,865 B2 | 6/2006 | Kister et al. |
| 7,061,257 B2 | 6/2006 | Khandros et al. |
| 7,064,564 B2 | 6/2006 | Kister et al. |
| 7,068,057 B2 | 6/2006 | Tervo et al. |
| D525,207 S | 7/2006 | Kister et al. |
| 7,071,715 B2 | 7/2006 | Shinde et al. |
| 7,073,254 B2 | 7/2006 | Eldridge et al. |
| 7,078,921 B2 | 7/2006 | Haga et al. |
| 7,088,118 B2 | 8/2006 | Liu et al. |
| 7,091,729 B2 | 8/2006 | Kister |
| 7,108,546 B2 | 9/2006 | Miller et al. |
| 7,109,731 B2 | 9/2006 | Gleason et al. |
| 7,126,361 B1 | 10/2006 | Anderson et al. |
| 7,143,500 B2 | 12/2006 | Byrd |
| 7,148,709 B2 | 12/2006 | Kister |
| 7,150,658 B1 | 12/2006 | Chien |
| 7,173,441 B2 | 2/2007 | Kister et al. |
| 7,189,078 B2 | 3/2007 | Kister et al. |
| 7,202,682 B2 | 4/2007 | Cooper et al. |
| 7,217,138 B2 | 5/2007 | Kister et al. |
| 7,218,127 B2 | 5/2007 | Cooper et al. |
| 7,218,131 B2 | 5/2007 | Tanioka et al. |
| 7,225,538 B2 | 6/2007 | Eldridge et al. |
| 7,227,371 B2 | 6/2007 | Miller |
| 7,265,565 B2 | 9/2007 | Chen et al. |
| 7,274,195 B2 | 9/2007 | Takemoto et al. |
| 7,281,305 B1 | 10/2007 | Iyer |
| 7,285,966 B2 | 10/2007 | Lee et al. |
| 7,312,617 B2 | 12/2007 | Kister |
| 7,345,492 B2 | 3/2008 | Kister |
| 7,417,447 B2 | 8/2008 | Kister |
| 7,436,192 B2 | 10/2008 | Kister |
| 7,511,523 B2 | 3/2009 | Chen et al. |
| 7,514,948 B2 | 4/2009 | Kister |
| 7,649,367 B2 | 1/2010 | Kister |
| 7,659,739 B2 | 2/2010 | Kister |
| 7,667,471 B2 | 2/2010 | Kurotori et al. |
| 7,671,610 B2 | 3/2010 | Kister |
| 7,733,101 B2 | 6/2010 | Kister |
| 7,733,103 B2 * | 6/2010 | Park et al. ................ 324/754.07 |
| 7,759,949 B2 | 7/2010 | Kister |
| 7,786,740 B2 | 8/2010 | Kister |
| 7,944,224 B2 | 5/2011 | Kister |
| 7,952,377 B2 | 5/2011 | Kister |
| RE43,503 E | 7/2012 | Kister |
| 8,230,593 B2 | 7/2012 | Kister |
| 8,299,394 B2 | 10/2012 | Theppakuttai et al. |
| 8,310,253 B1 | 11/2012 | Mardi et al. |
| 8,415,963 B2 | 4/2013 | Kister |
| RE44,407 E | 8/2013 | Kister |
| 2001/0012739 A1 | 8/2001 | Grube et al. |
| 2002/0070743 A1 | 6/2002 | Felici et al. |
| 2002/0125584 A1 | 9/2002 | Umehara et al. |
| 2002/0153913 A1 * | 10/2002 | Okubo et al. ................ 324/761 |
| 2002/0177782 A1 | 11/2002 | Penner |
| 2002/0190738 A1 | 12/2002 | Beaman et al. |
| 2002/0194730 A1 | 12/2002 | Shih et al. |
| 2003/0016346 A1 | 1/2003 | Umeda et al. |
| 2003/0027423 A1 | 2/2003 | Zhou et al. |
| 2003/0116346 A1 | 6/2003 | Forster et al. |
| 2003/0218244 A1 | 11/2003 | Lahiri et al. |
| 2003/0218865 A1 | 11/2003 | Macias |
| 2004/0036493 A1 | 2/2004 | Miller |
| 2004/0046579 A1 | 3/2004 | Chraft et al. |
| 2004/0119485 A1 | 6/2004 | Koch et al. |
| 2004/0239352 A1 | 12/2004 | Mizoguchi |
| 2005/0012513 A1 | 1/2005 | Cheng |
| 2005/0179458 A1 | 8/2005 | Chen et al. |
| 2005/0184743 A1 | 8/2005 | Kimura |
| 2005/0189955 A1 | 9/2005 | Takemoto et al. |
| 2006/0033516 A1 | 2/2006 | Rincon et al. |
| 2006/0040417 A1 | 2/2006 | Eldridge et al. |
| 2006/0073712 A1 | 4/2006 | Suhir |
| 2006/0170440 A1 | 8/2006 | Sudin |
| 2006/0171425 A1 | 8/2006 | Lee et al. |
| 2006/0186905 A1 | 8/2006 | Kohashi et al. |
| 2006/0189867 A1 | 8/2006 | Revie et al. |
| 2006/0208752 A1 | 9/2006 | Tanioka et al. |
| 2006/0261828 A1 | 11/2006 | Cram et al. |
| 2007/0145989 A1 | 6/2007 | Zhu et al. |
| 2007/0167022 A1 | 7/2007 | Tsai et al. |
| 2007/0229103 A1 | 10/2007 | Tani |
| 2008/0001613 A1 | 1/2008 | Kister |
| 2008/0074132 A1 | 3/2008 | Fan et al. |
| 2008/0088331 A1 | 4/2008 | Yoshida |
| 2008/0258746 A1 | 10/2008 | Tran et al. |
| 2009/0079455 A1 | 3/2009 | Gritters |
| 2010/0176832 A1 | 7/2010 | Kister |
| 2010/0182030 A1 | 7/2010 | Kister |
| 2010/0182031 A1 | 7/2010 | Kister |
| 2010/0289512 A1 | 11/2010 | Kister |
| 2011/0006796 A1 | 1/2011 | Kister |
| 2011/0062978 A1 | 3/2011 | Kister |
| 2011/0273198 A1 | 11/2011 | Kister |
| 2011/0273199 A1 | 11/2011 | Kister |
| 2012/0242363 A1 | 9/2012 | Breinlinger et al. |
| 2012/0286816 A1 | 11/2012 | Kister |
| 2012/0313621 A1 | 12/2012 | Kister |
| 2012/0313660 A1 | 12/2012 | Kister |
| 2013/0082729 A1 | 4/2013 | Fan et al. |
| 2013/0093450 A1 | 4/2013 | Kister |

FOREIGN PATENT DOCUMENTS

| | | |
|---|---|---|
| EP | 0402756 | 12/1990 |
| EP | 0764352 | 5/2004 |
| JP | 63-307678 | 12/1988 |
| JP | 01128535 | 5/1989 |
| JP | 7-021968 | 1/1995 |
| JP | 7-333232 | 12/1995 |
| JP | 10506238 | 6/1998 |
| JP | 10221374 | 8/1998 |
| JP | 10311864 | 11/1998 |
| JP | 11044727 | 2/1999 |
| TW | 201109669 | 3/2011 |
| WO | WO 92/10010 | 6/1982 |
| WO | WO 87/04568 | 7/1987 |
| WO | WO 96/15458 | 5/1996 |
| WO | WO 96/37332 | 11/1996 |
| WO | WO 97/43653 | 11/1997 |
| WO | WO 00/54066 | 9/2000 |
| WO | WO 01/09623 | 2/2001 |

OTHER PUBLICATIONS

Sporck, "A New Probe Card Technology Using Compliant Microsprings", Proceedings 1997 IEEE International Test Conference, Nov. 1, 1997, 527-532.

* cited by examiner

PROBE RETENTION ARRANGEMENT

CROSS-REFERENCE TO RELATED APPLICATIONS

This application is a divisional application of U.S. patent application Ser. No. 12/871,420, entitled "Probe Retention Arrangement", to January Kister et al., filed on Aug. 30, 2010, and issuing as U.S. Pat. No. 8,907,689 on Dec. 9, 2014, which application is a continuation-in-part application of U.S. patent application Ser. No. 11/580,204, entitled "Probe Cards Employing Probes Having Retaining Portions for Potting in a Potting Region", to January Kister, filed on Oct. 11, 2006 and issued as U.S. Pat. No. 7,786,740 on Aug. 31, 2010, and the specification and claims thereof are incorporated herein by reference.

STATEMENT REGARDING FEDERALLY SPONSORED RESEARCH OR DEVELOPMENT

Not Applicable.

INCORPORATION BY REFERENCE OF MATERIAL SUBMITTED ON A COMPACT DISC

Not Applicable.

COPYRIGHTED MATERIAL

Not Applicable.

BACKGROUND OF THE INVENTION

1. Field of the Invention (Technical Field)

This invention relates generally to apparatus and method for retaining probes in an electrical testing arrangement such as a probe card, and more specifically to securing and aligning such probes in a retention arrangement to ensure superior mechanical and electrical performance.

2. Description of Related Art

Note that the following discussion refers to a number of publications by author(s) and year of publication, and that due to recent publication dates certain publications are not to be considered as prior art vis-a-vis the present invention. Discussion of such publications herein is given for more complete background and is not to be construed as an admission that such publications are prior art for patentability determination purposes.

The testing of semiconductor wafers and other types of integrated circuits (ICs), collectively known as devices under test (DUTs), needs to keep pace with technological advances. Each IC has to be individually tested, typically before dicing, in order to ensure that it functions properly. The demand for testing products is driven by considerations of new chip designs and higher volumes.

In particular, chips are getting smaller and they have more tightly spaced contact pads. The pads are no longer located about the circuit perimeter, but in some designs may be found within the area occupied by the circuit itself. As a result, the spacing or pitch of probe arrays required to establish electrical contact with the pads or bumps is decreasing. In addition, the requirements on planarity are increasing.

Some of the problems associated with small pitch of contact pads and their arrangement in a dense two-dimensional array are addressed in the prior art. For example, U.S. Pat. No. 6,881,974 to Wood et al. teaches to arrange probes in a probe card that has a substrate with a plurality of blind holes on a front face. The holes are filled with a metal to establish electrical contact for testing purposes and have closed bottoms spaced from a back of the substrate. Another approach is taught in U.S. Pat. No. 6,586,955 and U.S. Published Application No. 2002/0000815 both to Fjelstad et al. where probe cards include a layer of dielectric material provided with a plurality of cavities on a substrate. The dielectric material separates the fusible conductive material that is used to form the probe contacts. Both approaches provide ways to arrange probes that can address pads in a dense array.

In an approach that employs a housing for holding the individual probes, U.S. Pat. No. 6,566,898 to Theissen at al. teach an improved vertical pin probing device that has upper and lower spacers made of Invar. The spacers have a thin sheet of silicon nitride ceramic material held in a window in the spacer by an adhesive. The sheets of silicon nitride have laser-drilled matching patterns of holes supporting the probe pins and insulating them from the housing. The probes held in the holes can be arranged to address pads in a dense array.

Unfortunately, merely providing a geometry or method of holding probes that can address a dense array of pads is not sufficient. It is also important to ensure that the probes have suitable mechanical resilience and compliance properties. One way of addressing these mechanical issues is discussed, for example, in U.S. Published Application No. 2002/0117330 to Eldridge at al. This reference teaches structures that have improved resilience or compliance because the wire used for contact is overcoated with at least one layer of a material chosen for its structural resiliency or compliance characteristics. The probes have springy shapes and are attached to a substrate in, e.g., a probe card.

Although the prior art solutions individually address some of the problems, there is no apparatus or method that combines the requisite characteristics in a single probe card or testing apparatus. Specifically, what is needed is an electrical testing apparatus that can address densely packed pads or bumps with probes that are held securely while offering requisite mechanical properties such as resilience, compliance and reliable scrub motion to remove oxide from the pads or bumps.

In view of the above prior art limitations, it is an object of the invention to provide for a method and apparatus for electrical testing of devices under test (DUTs) that have densely spaced contact pads or bumps. The object is to ensure that the probes used in such apparatus are appropriately held and designed to ensure advantageous mechanical properties, including resilience, compliance and scrub motion.

It is another object of the invention to ensure that the apparatus is easy to assemble and disassemble despite the small pitch of the probes.

These and other objects and advantages of the invention will become apparent from the ensuing description.

BRIEF SUMMARY OF THE INVENTION

One embodiment of the present invention comprises a probe retention arrangement for holding one or more probes. The probe retention arrangement of this embodiment of the present invention preferably comprises at least one guide plate, wherein the guide plate comprises at least one opening for disposing one or more probes, at least one spacer, and at least one anti-wicking template disposed above at least one guide plate. The anti-wicking template preferably comprises a pliable material, and more preferably comprises a polyimide material. The arrangement of this embodiment can optionally comprise a potting agent, preferably an epoxy. The guide plate preferably comprises a compliant material and more preferably comprises a polyimide material. The probe retention arrangement preferably comprises two guide plates and two anti-wicking templates. The probe retention arrangement of this embodiment of the present invention preferably does not comprise a holder at a probe tip level.

Another embodiment of the present invention comprises a method of assembling a probe retention assembly. The method of this embodiment preferably comprises providing at least one guide plate having holes, disposing above the at least one guide plate, a first anti-wicking template having holes, aligning the holes of the at least one guide plate and the anti-wicking template, pressing one or more probes into the holes of the at least one guide plate and the anti-wicking template, and aligning the probes in the probe retention assembly. A second guide plate is optionally provided and a spacer is preferably placed between the first guide plate and the second guide plate. A potting agent is preferably disposed between the first guide plate and second guide plate. A second anti-wicking template is preferably disposed above the second guide plate. The aligning step of this method can be performed either automatically or manually. The probes of this embodiment of the present invention are preferably fixed in a vertical position in the probe retention assembly.

Yet another embodiment of the present invention comprises a retention arrangement for holding one or more probes. This embodiment of the present invention preferably comprises a top plate having openings for one or more probes, a bottom plate having openings for one or more probes, and a removable tip holder disposed on the retention arrangement, the removable tip holder comprising openings for holding the one or more probes near one or more probe tips. The retention arrangement of this embodiment of the present invention can optionally include a frame positioning the bottom plate relative to the tip holder. The top plate and bottom plate preferably comprise a space therebetween. The retention arrangement of this embodiment can also include a potting region between the top plate and bottom plate for potting a potting agent. At least intermediate plate can optionally be provided in the potting region. The intermediate plate comprises openings for the one or more probes.

One embodiment of the present invention comprises a retention arrangement for holding one or more probes. This embodiment preferably comprises a top plate having openings for one or more probes, a bottom plate having openings for one or more probes, and a tip holder disposed on the retention arrangement, the tip holder comprising openings for holding one or more probes near the tips of one or more probes, and a frame positioning the bottom plate relative to the tip holder. This embodiment can also include a potting region between the top plate and the bottom plate for potting a potting agent in the retention arrangement. Optionally, an intermediate plate is provided and is located in the potting region and has probe guide openings for the probes. The tip holder can be removable. A lateral barrier can be provided for enclosing a potting agent.

Another embodiment of the present invention comprises a retention arrangement for holding one or more probes. This embodiment preferably comprises a top plate having opening for one or more probes, a bottom plate having opening for one or more probes, a potting region between the top plate and the bottom plate for potting a potting agent in the retention arrangement, and at least one intermediate plate located in the potting region and having one or more probe guide openings for one or more probes. This embodiment of the present invention can optionally include a tip holder disposed on the retention arrangement, the tip holder comprising openings for holding the probes near the contacting tips. A frame is optionally provided for positioning the bottom plate relative to the Up holder. A al barrier is preferably provided for enclosing the potting agent in the potting region.

The objects and advantages of the invention are secured by a method and an apparatus for electrical testing of a device under test (DUT). The apparatus has a number of probes each of which has a connect end for applying a test signal, a retaining portion, at least one arm portion and a contact tip for making an electrical contact with the DUT. Further, the apparatus has a retention arrangement for holding each of the probes. Specifically, the retention arrangement has a tip holder for holding each of the probes by its contacting tip and a plate with openings for holding each of the probes below the retaining portion. The retaining portion of each of the probes is potted in a potting region defined above the plate with the aid of a potting agent. The potting agent can be any suitable potting material such as an epoxy selected for appropriate viscosity and curing properties. In some embodiments the apparatus further comprises a lateral enclosure or, more generally a lateral barrier for enclosing the potting region to help contain the epoxy prior to curing.

In a preferred embodiment the openings in the plate are laser-machined openings. The laser machining process allows one to achieve very precise dimensional tolerances and opening profiles.

In some applications the apparatus is used in conjunction with a space transformer. The space transformer has closely spaced or high pitch contacts for contacting each of the probes at the connect end. The connection can be permanent or, preferably temporary. Suitable temporary connections can be achieved by soldering. The use of the space transformer is particularly advantageous when the apparatus is employed in a probe card.

The apparatus admits the use of many types of probes. Preferably, however, the probes are non-linear. For example, each probe has at least two arm portions joined by a knee. In one specific embodiment, the probes have at least two arm portions with a base arm portion extending away from a center axis of the probe and a reverse arm portion extending toward the center axis. The knee joins the base arm portion with the reverse arm portion. The contacting tip is located on the reverse arm portion distal from the knee and the contacting tip has a non-zero offset relative to the center axis. Alternatively, the probes can have at least one non-linear arm portion that extends from the center axis such that the contacting tip again exhibits a non-zero offset relative to the center axis. In any of the embodiments of the apparatus, the probes can be of the type endowed with a protrusion on the contacting tip for ensuring high quality electrical contact.

The invention further extends to a method for electrical testing of a DUT with a number of probes each having a connect end for applying a test signal, at least one arm portion and a contacting tip for making an electrical contact with the DUT. Each of the probes is provided with a retaining portion and a retention arrangement is provided for holding each of the probes by its contacting tip and also below its retaining portion. According to the method a potting region is created for potting the retaining portion of each probe in a potting agent. The potting agent is admitted into the potting region once the probes are properly held to pot the retaining portions of the probes.

Preferably, the retention arrangement has a plate with holes for holding each of the probes below its retaining portion and the holes are made by laser machining. Additionally, the retention arrangement has a tip holder for holding each of the probes by its contacting tip. The tip holder can be removed after potting or left in place for testing.

According to the method, a space transformer can be provided for contacting the probes a connect ends and applying the test signals thereto.

A detailed description of the preferred embodiments of the invention is presented below in reference to the appended drawing figures.

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE SEVERAL VIEWS OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1:
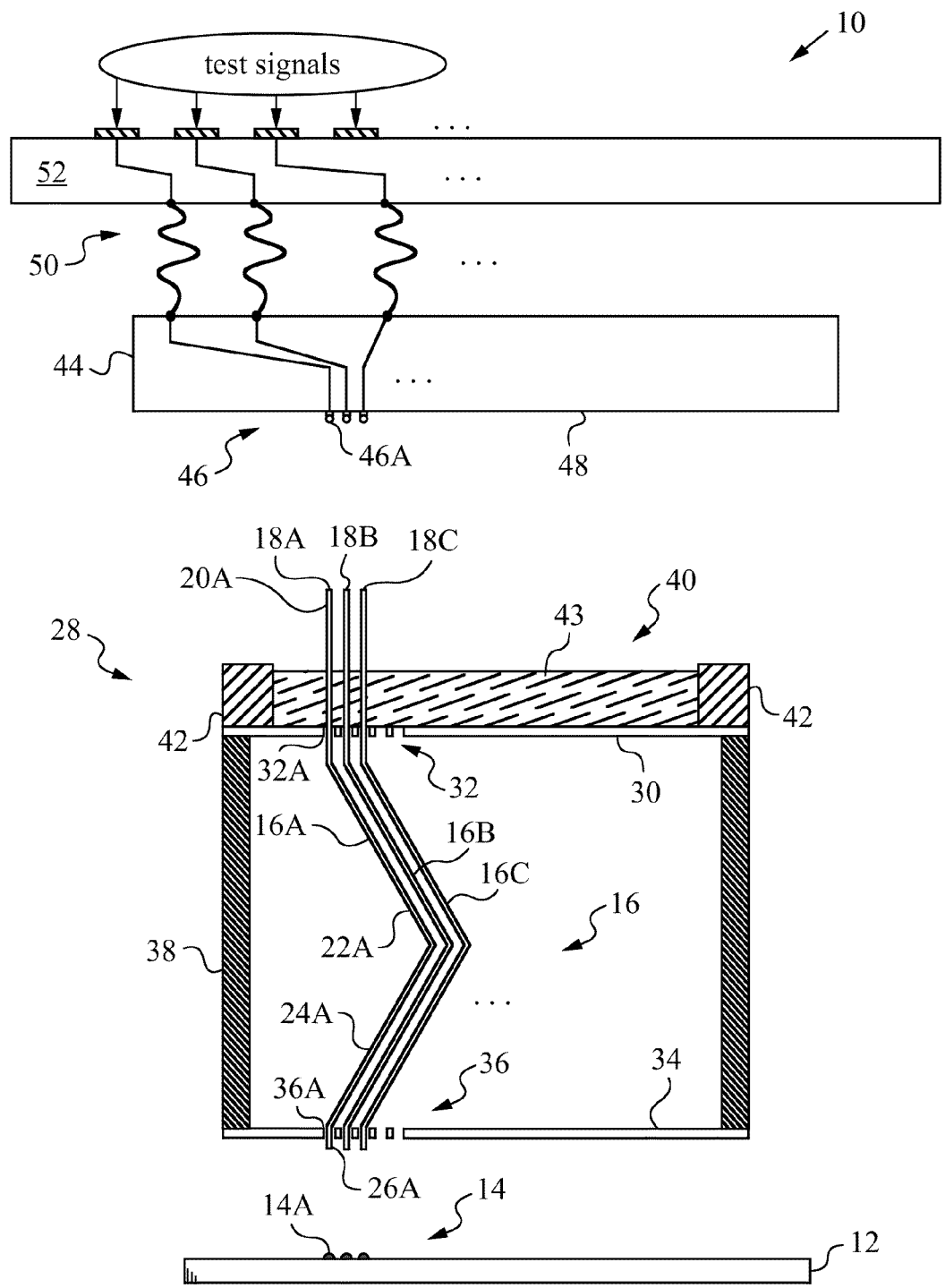
FIG. 1 is a diagram illustrating an apparatus of the invention employed with a space transformer.

The present invention will be best understood by first reviewing an apparatus 10 of the invention as shown in the diagram of FIG. 1. Apparatus 10 can be employed in a probe card or other electrical testing equipment for testing a device under test (DUT) 12. Frequently, DUT 12 is an integrated circuit on a wafer that requires testing prior to dicing. Alternatively, DUT 12 is an electronic device or circuit that is already mounted. The functionality of DUT 12 is verified by applying test signals to a number of its bumps or pads 14.

Apparatus 10 has a number of probes 16 arranged in an array and designed for establishing electrical contact with pads or bumps 14. Typically, the number of probes 16 is large and their spacing or pitch is very small, e.g., on the order of several microns. For clarity, only three probes 16A, 16B, 16C are illustrated. The construction of all probes 16 is analogous and will be explained by referring explicitly to probe 16A.

Probe 16A has connect end 18A for applying the test signal, retaining portion 20A and two arm portions 22A, 24A. Arm portion 24A terminates in contacting tip 26A for making electrical contact with corresponding bump 14A of DUT 12.

Apparatus 10 has retention arrangement or assembly 28 for holding each of probes 16 below its retaining portion 20 and just above arm portions 22, 24. More precisely, retention arrangement 28 has plate 30 with openings 32. Preferably, plate 30 is a ceramic plate. Openings 32 are provided for receiving and guiding retaining portions 20 of probes 16. To ensure accurate placement of probes 16 in retention arrangement 28 openings 32 are precision machined. Preferably, openings 32 are laser-machined openings.

Further, retention arrangement or assembly 28 has holder 34 for holding probes 16 by their contacting tips 26. Holder 34 can be made of various materials, but in the present case it is made of polyimide. A series of holes 36 in holder 34 is designed to retain contacting tips 26. Holes 36 preferably have a suitable structure or cross-section to ensure that, once inserted, contacting tips 26 stay in holes 36 unless intentionally removed. Frame 38 keeps holder 34 in the appropriate position with respect to plate 30 to ensure that probes 16 are all well-aligned and their contacting tips 26 maintain a high level of planarity.

Retaining portions 20 of probes 16 are potted with potting agent 43 in potting region 40 defined above plate 30. Lateral enclosure 42, here in the form of a lateral barrier mounted on top of and about the perimeter of plate 30 defines potting region 40. A person skilled in the art will recognize that lateral enclosure 42 is especially useful for containing any low-viscosity potting agent 43 prior to curing or when a significant thickness of potting agent 43 needs to be employed. A suitable potting agent 43 is an epoxy that exhibits proper wetting with respect to plate 30 and retaining portions 20 of probes 16 and hardens upon contact with atmospheric oxygen. Potting agent 43 may be poured into potting region 40 from above once probes 16 are properly aligned both horizontally and vertically. As potting agent 42 cures and hardens, probes 16 are retained in their proper positions.

Apparatus 10 also has space transformer 44 with probe contacts 46 on its bottom surface 48 for contacting probes 16 at their connect ends 18. Specifically, space transformer 44 is employed for establishing electrical connections between test signal leads 50 from testing device 52, e.g., a testing circuit on a printed circuit board, and probes 16. In contrast to signal leads 50, probe contacts 46 on bottom surface 48 are densely spaced and can be directly connected to probes 16. For example, in the case of probe 16A, its connect end 18A is assigned to establish electrical connection with contact 46A. In practice this is preferably done by providing a soldering ball on contact 46A and soldering connect end 18A thereto. Other alternatives, such as a side friction connector between connect end 18A and contact 46A can also be used to establish electrical connection.

Space transformer 44 allows the user to convert relatively sparsely spaced leads 50 to an array of much more densely spaced or high pitch probe contacts 46 for accessing very densely spaced probes 16. Probes 16, in turn, require tight spacing in order to access very densely packed and small pads or bumps 14 of DUT 12. Various types of space transformers and routing strategies are known to those skilled in the art. Any of those can be applied in apparatus 10. In addition, testing device 52 can generate test signals directly, receive external instructions for generating test signals or simply receive some or all of the test signals and assign them to signal leads 50.

During operation, probes 16 of apparatus 10 are placed in physical contact with bumps 14 to establish electrical contact. Electrical contact is not only due to physical contact, but also due to a scrubbing motion executed by contacting tips 26 of probes 16 while engaging with bumps 14. The scrubbing motion removes surface oxidation from bumps 14 and thus ensures a low-resistance electrical contact so that the test signals are efficiently delivered to bumps 14.

Figure 2:
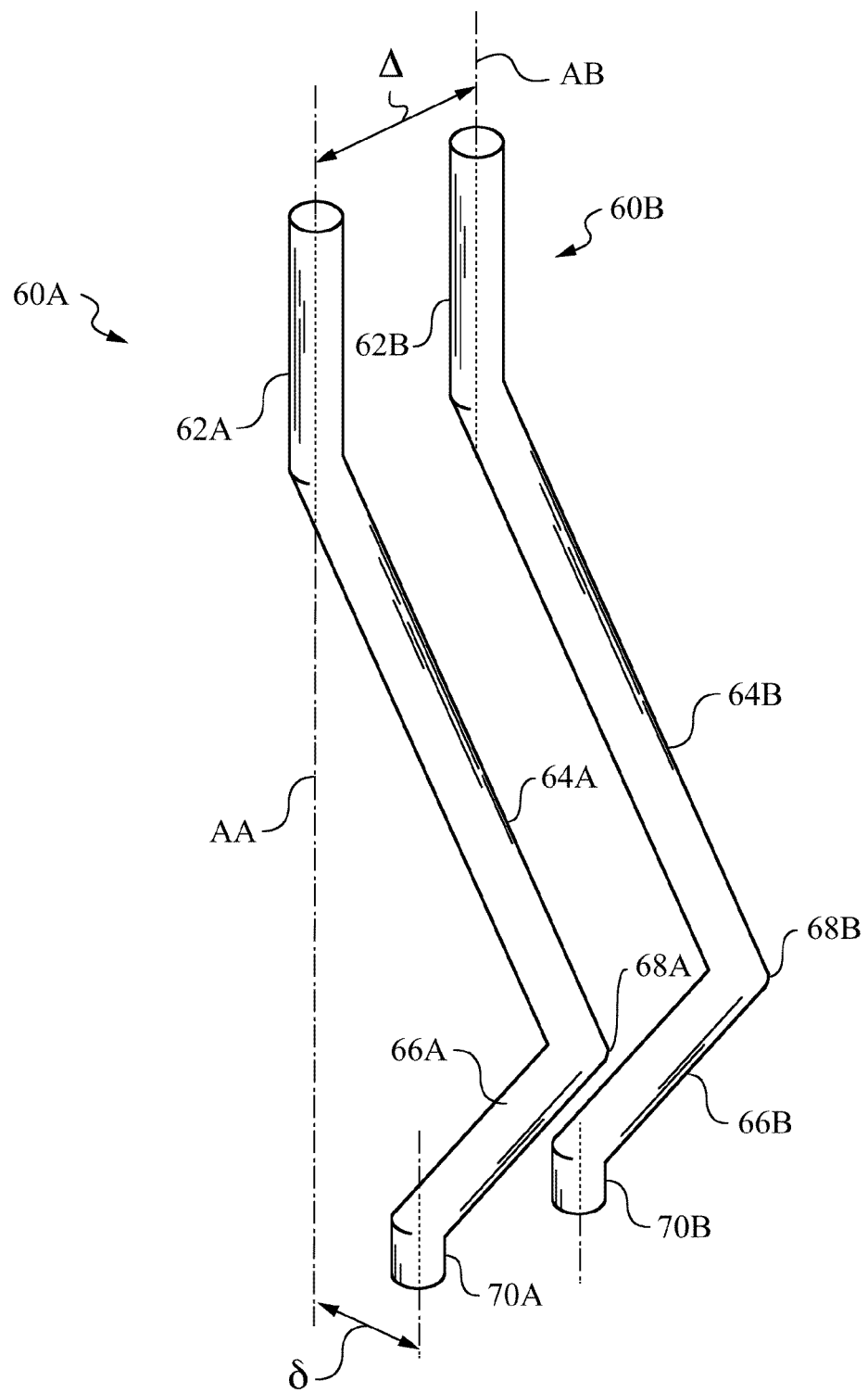
FIG. 2 is an isometric view of two probes that can be used in accordance with the invention.

Apparatus 10 can employ probes of various types and geometries, including probes with two or more arm portions. FIG. 2 is an isometric view of two exemplary probes 60A, 60B that can be used in apparatus 10. Each one of probes 60 has retention portion 62A, 62B and two arm portions 64A, 66A and 64B, 66B, respectively. More precisely, arm portions 64A, 64B are base arm portions extending away from center axes AA, AB of probes 60A, 60B, and arm portions 66A, 66B are reverse arm portions extending back toward center axes AA, AB. Base and reverse arm portions 64A, 64B and 66A, 66B inflect at corresponding joints or knees 68A, 68B. This geometry lends probes 60A, 60B a measure of mechanical flexibility that allows contacting tips 70A, 70B of probes 60A, 60B to perform effective scrubbing movements when brought in contact with pads or bumps 14 of DUT 12.

Probes 60 have round cross-sections and are spaced at a pitch Δ. In a preferred embodiment, contacting tips 70A, 70B are located on reverse arm portions 66A, 66B distal from knees 68A, 68B with a non-zero offset δ relative to center axes AA, AB, respectively. Non-zero offset δ further improves the scrubbing behavior of probes 60.

Figure 3:
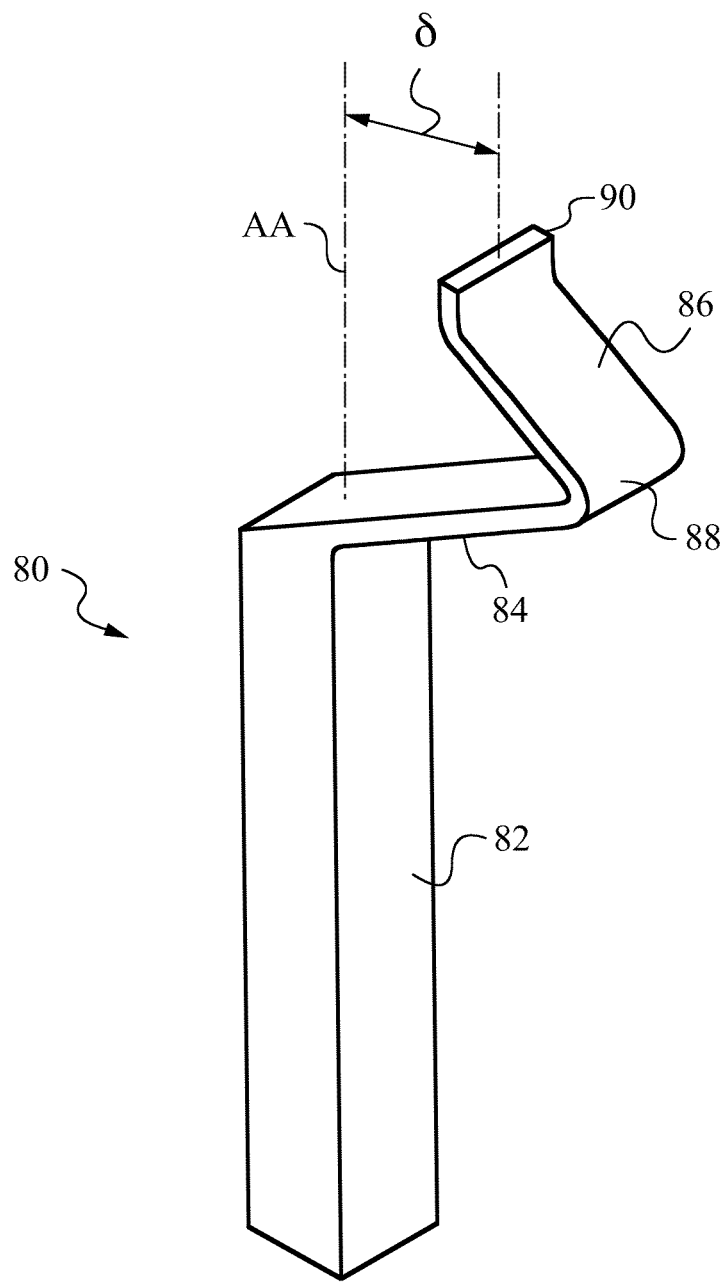
FIG. 3 is an isometric view of another probe that can be used in accordance with the invention.

Apparatus 10 can use other probes that have non-circular cross-sections. FIG. 3 illustrates in an isometric view of probe 80 that has a generally rectangular and varying cross-section. Probe 80 has retention portion 82, base arm portion 84, reverse arm portion 86, knee 88 and contacting tip 90. Once again, contacting tip 90 has a non-zero offset 8 relative to a center axis AA of probe 80 to achieve improved scrubbing motion.

Figure 4:
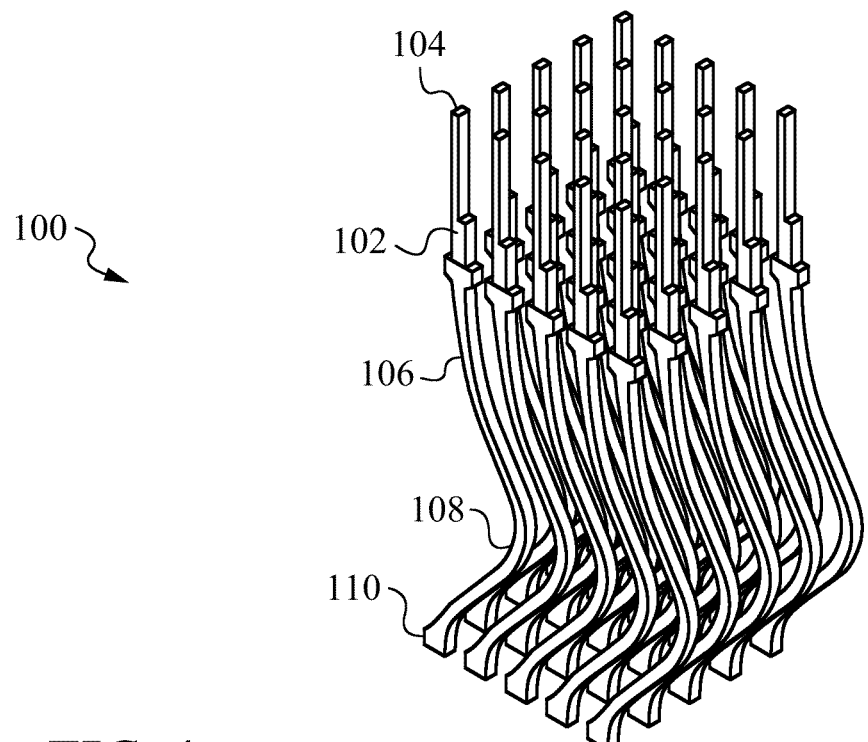
FIG. 4 is a three-dimensional view of other probes with non-linear portions.

In still other embodiments, apparatus 10 uses probes that have one or more non-linear arm portions. FIG. 4 illustrates an array of probes 100 each having a retention portion for being potted in retention arrangement 28 and contact end 104. Each probe 100 has non-linear arm portion 106 with knee 108. Arm portion 106 terminates in contacting tip 110. Note that contact end 104 of each probe 100 is designed for making side friction connections rather than a soldered connection. In other words, contact end 104 is designed to be placed into a metallized hole of a ceramic plate located above retention arrangement 28 and contact is established by sliding the ceramic plate sideways to ensure mechanical contact with contact end 104. In this case space transformer 44 establishes electrical connections with contact end 104 via a soldered connection to the ceramic plate. Alternatively, space transformer 44 may itself be provided with metallized holes for receiving contact end 104 of each probe 100. Also note that in this embodiment there is no offset between contacting tip 110 and the center axis of probe 100.

Figure 5:
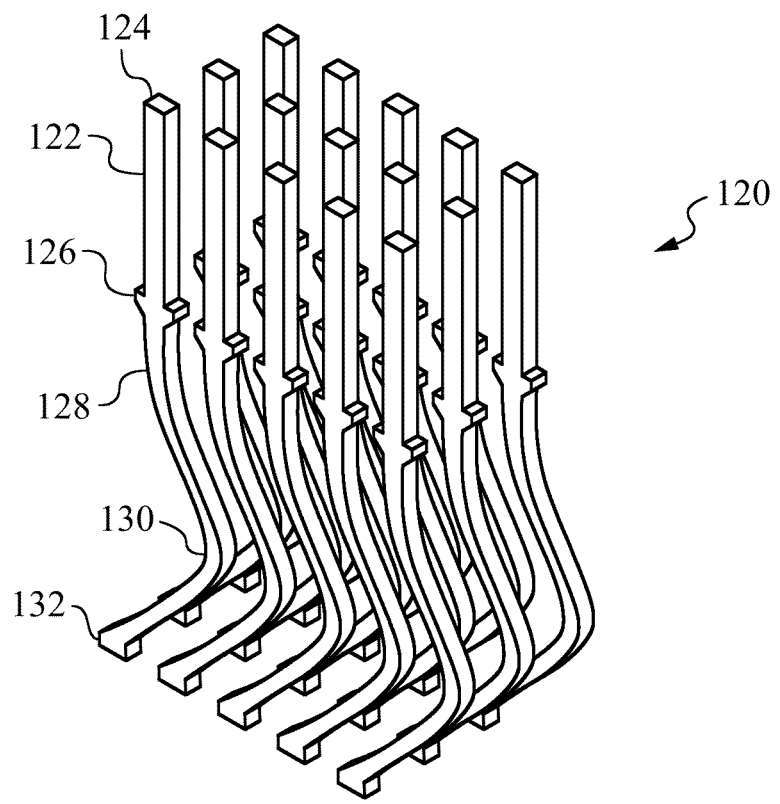
FIG. 5 is a three dimensional view of still other probes with non-linear portions.

FIG. 5 shows an array of probes 120 each having retention portion 122 terminated in contact end 124. Stop 126 is provided at the lower end of retention portion 122 to help align probes 120 in a retention arrangement and aid in maintaining their planarity. The presence of stop 126 also aids in keeping the potting agent in the potting region during assembly.

Each probe 120 has non-linear arm portion 128 with joint or knee 130. Non-linear arm portion 128 has a varying degree of curvature along its length and terminates in a contacting tip 132. Tip 132 is offset from the center axis of probe 120 in order to provide for improved scrubbing behavior.

Figure 6:
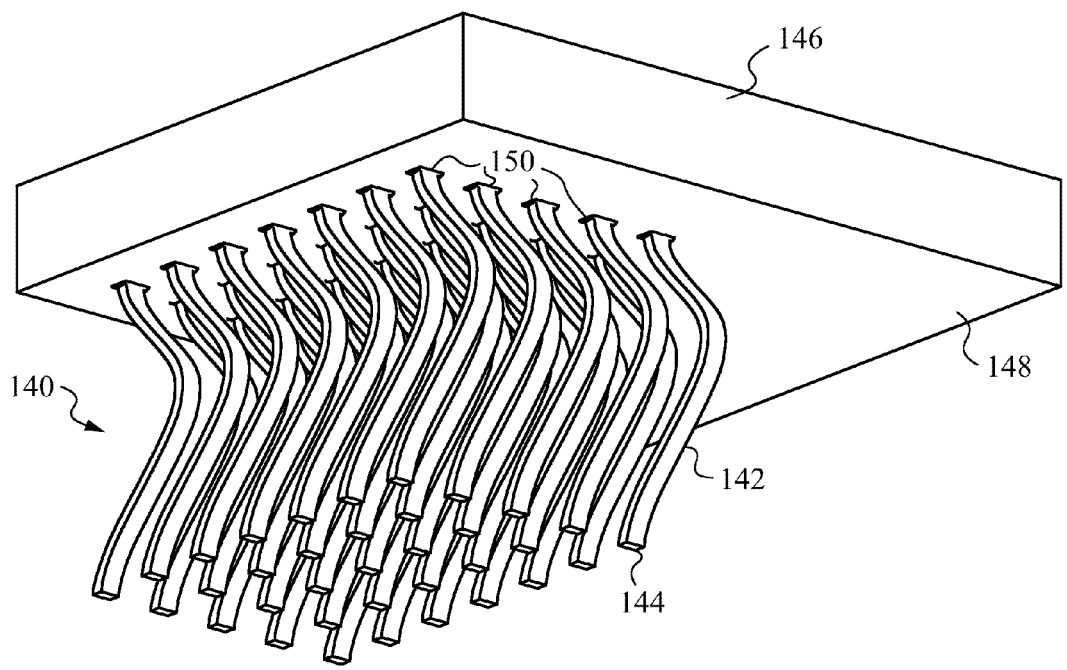
FIG. 6 is a three-dimensional view illustrating an array of probes held in a retention arrangement.

FIG. 6 is a three dimensional view illustrating an array of probes 140 each having non-linear arm portion 142 and contacting tip 144. Probes 140 are mounted in a retention arrangement 146 and extend out from plate 148 through openings 150. The holder for holding probes 140 at contacting tips 144 has been removed in this embodiment. Arrangement 146 is fully assembled and probes 140 are potted in the potting agent in the potting region (not visible) of arrangement 146.

Figure 7:
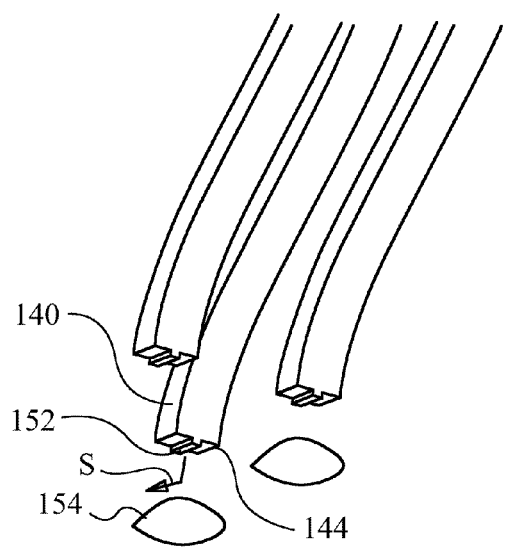
FIG. 7 is a three-dimensional view illustrating the operation of a scrubbing protrusion on a contacting tip of a probe from the array of FIG. 6.

FIG. 7 illustrates contacting tip 144 of a particular probe 140 in more detail. The bottom surface of tip 144, which is the surface that comes in contact with pad or bump 154, is provided with scrubbing protrusion 152. Protrusion 152 is a raised, rectangular portion of the bottom surface of tip 144. Although other geometries are possible, this type of protrusion 152 is preferred. During operation, as a contact force is applied, tip 144 comes in contact with bump 154 and executes a lateral scrubbing motion, as indicated by arrow S. The scrubbing motion helps to remove oxide from bump 154 and establish a good electrical contact.

Terminating the tips with scrubbing protrusions in any apparatus of the invention is preferred, since it improves the scrubbing behavior of the probes. It should also be noted, that due to the improved hold of the probes achieved by potting them in the potting enclosure, as well as any axial offset of their tips, all of these measures cooperate to produce a very effective scrubbing movement.

Figure 8:
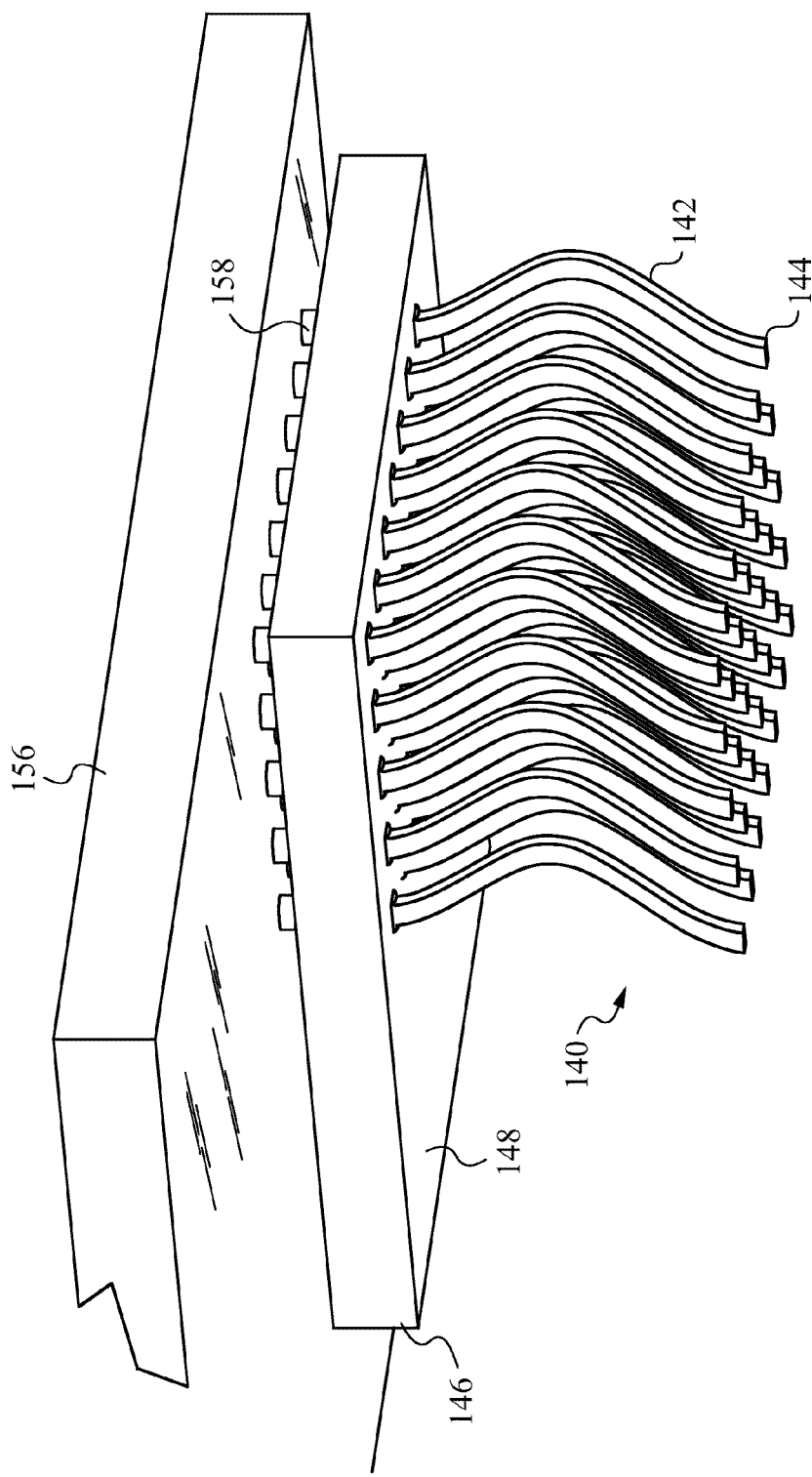
FIG. 8 is a three-dimensional view illustrating the array of probes and retention arrangement of FIG. 6 attached to a space transformer in accordance with the invention.

FIG. 8 is a three-dimensional view of the array of probes 140 in retention arrangement 146 attached to space transformer 156. In this embodiment connections to space transformer 156 contacts are soldered connections 158. Once completed, connections 158 can be capped with an epoxy or adhesive for protection.

Figure 9A:
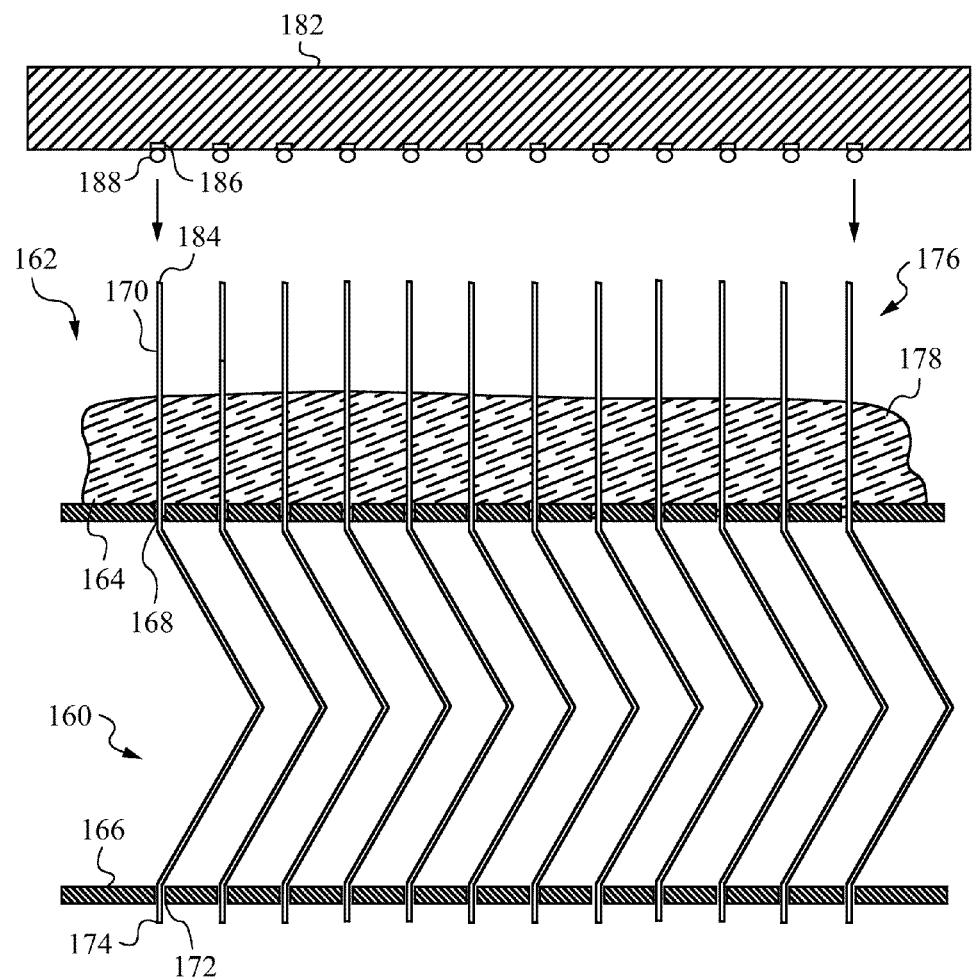
FIG. 9A is a plan cross sectional view illustrating a method of attaching probes held in a retention arrangement of FIG. 9 to a space transformer.

FIG. 9A is a plan cross sectional view illustrating set of probes 160 in retention arrangement 162 that employs plate 164 and holder 166. Plate 164 has openings 168 for holding probes 160 below their retaining portions 170. Holder 166 has openings 172 for keeping contacting tips 174 of probes 160. Potting region 176 is defined above plate 164. Potting region 176 does not include any lateral barriers for containing a potting agent 178. In this embodiment, agent 178 is a sufficiently viscous epoxy to not require containment prior to curing. In addition, epoxy 178 may be applied and cured in layers to build up to the required thickness without the need for lateral containment.

Figure 9B:
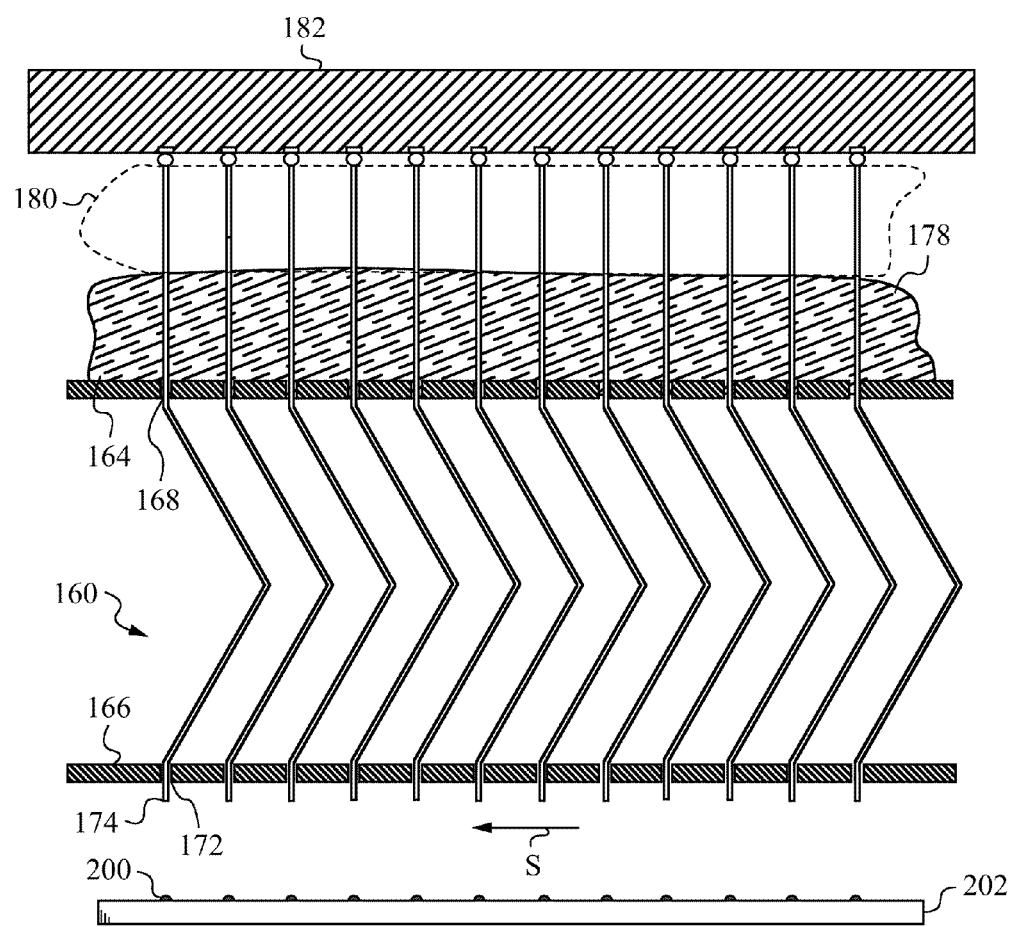
FIG. 9B is a plan cross sectional view illustrating the operation of probes in the retention arrangement of FIG. 9A when the holder is not removed.

In the view shown by FIG. 9 probes 160 are already potted in potting agent 178 and are being attached to space transformer 182. To establish the electrical connection, connect ends 184 or probes 160 are brought in contact with and soldered to pads 186 of transformer 182 by re-flowing solder balls 188. Preferably, underfill 180 (see FIG. 9B), typically of an epoxy or other stable dielectric is provided in order to strengthen the mechanical connection between transformer 182 and retention arrangement 162.

FIG. 9B is a plan cross sectional view illustrating the use of probes 160 mounted in retention arrangement 162 with holder 166 left in place over contacting tips 174 rather than removed. Due to the presence of holder 166 the motions and scrubs, as indicated by arrow S, of probes 160 are mechanically coupled. Thus, as contacting tips 174 engage with contact pads or bumps 200 of DUT 202 they will tend to execute more concerted scrub motion. Of course, a person skilled in the art will recognize that the decision to remove or keep holder 166 can be made on a case by case basis and depending on planarity, scrub length and contact force requirements when dealing with any particular DUT 202.

Figure 10:
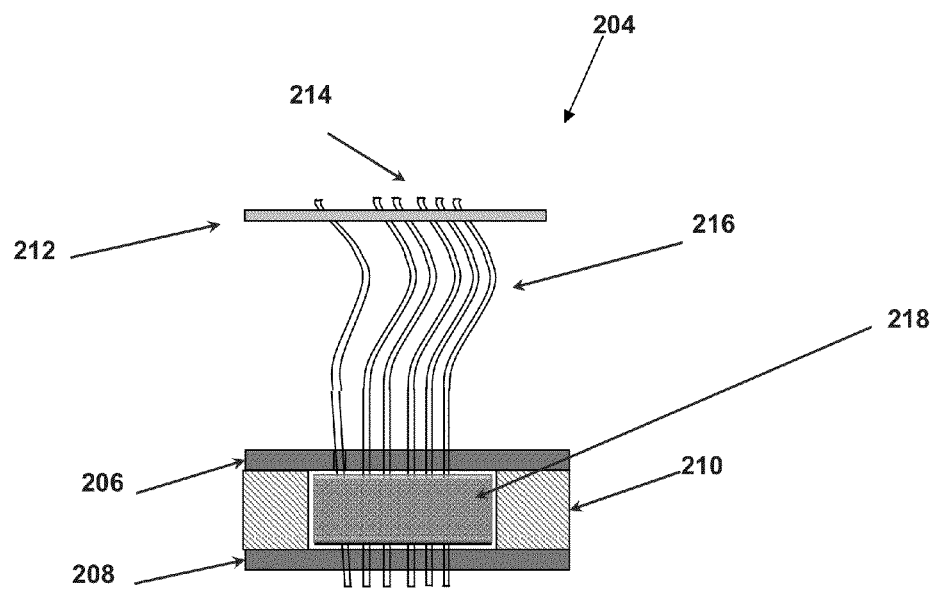
FIG. 10 is a prior art retention arrangement.

FIG. 10 illustrates prior art retention arrangement or assembly 204 comprising guide plates 206 and 208 having holes (not shown), spacer 210, and holder 212 for holding tips 214 of probes 216. Guide plates 206 and 208 are preferably made of a ceramic material, but can be made of any supportive material. Potting agent 218 preferably holds probes in place. Since ceramic or other material may be brittle and cannot take a probe press fit, the holes in guide plates 206 and 208 are oversized over the cross-sectional diameter or width of probes 216. The oversized holes are typically at least approximately 5 µm oversized over probes 216 cross sections. The oversized holes in the prior art do not fix probes 216 in the vertical location causing probe tip alignment errors. Using a template around the probe tips causes probe deformation during template removal, and a sagging template causes alignment errors.

Figure 11:
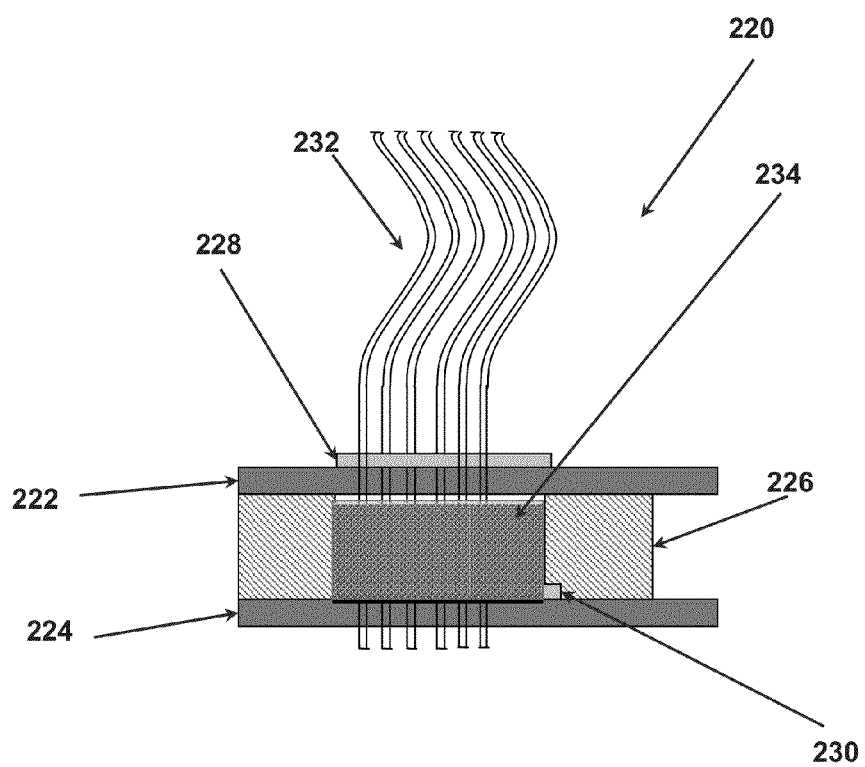
FIG. 11 is a retention arrangement comprising two templates for fixing probes in a vertical position.

FIG. 11 illustrates an embodiment of the present invention comprising retention arrangement or assembly 220. Retention arrangement or assembly 220 preferably comprises guide plates 222 and 224 having holes (not shown), spacer 226, and anti-wicking templates 228 and 230. Anti-wicking templates 228 and 230, preferably comprise smaller or undersized holes, more preferably holes between approximately 1 and 5 µm in diameter, and most preferably holes approximately 4 to 5 µm in diameter. Anti-wicking templates 228 and 230 allow for a light press fit between probes 232 and the holes in guide plates 222 and 224. Probes 232 are then preferably fixed in position, preferably a vertical position, thereby minimizing probe tip alignment errors. Templates 228 and 230 preferably comprise a compliant material and more preferably comprise a polyimide material. Templates 228 and 230 also prevent potting agent 234 from wicking up and/or down the probe shaft. Potting agent 234 is preferably used to assist in holding probes 232 in place. Retention arrangement or assembly 220 can secure probes without a holder located near the probe tips. Retention arrangement or assembly 220 preferably does not comprise a holder around the probe tips. Since no holder is required around the probe tips, the arrangement of probes in retention arrangement 220 can be automated by "pick and place". The automation can be by robotic or other means. Also since no tip holder is required, it is much easier for manual arrangement of probes in retention arrangement 220.

Any of the above-described embodiments can be implemented in a full-fledged testing system or probe card. The retention arrangement of the invention provides excellent mechanical characteristics to the probes it holds. In particular, even in very dense arrays that address densely packed probe pads or bumps the probes are held securely while offering requisite mechanical properties such as resilience, compliance and reliable scrub motion to remove oxide from the contact pads or bumps.

Many other embodiments of the apparatus and method are possible. Therefore, the scope of the invention should be judged by the appended claims and theft legal equivalents.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A method of assembling a probe retention assembly comprising:
    providing at least one guide plate having holes;
    disposing above the at least one guide plate, a first anti-wicking template having holes;
    aligning the holes of the at least one guide plate and the anti-wicking template;
    pressing one or more probes into the holes of the at least one guide plate and the anti-wicking template; and
    aligning the probes in the probe retention assembly;
    the first anti-wicking template preventing a potting agent from wicking up and/or down a shaft of each of the one or more probes.

2. The method of claim 1 wherein a second guide plate is provided.

3. The method of claim 2 further comprising providing a spacer between the first guide plate and the second guide plates.

4. The method of claim 3 further comprising disposing a potting agent between the first guide plate and second guide plates.

5. The method of claim 2 wherein a second anti-wicking template is disposed above the second guide plate.

6. The method of claim 1 wherein the aligning step is performed automatically.

7. The method of claim 1 wherein the aligning step is performed manually.

8. The method of claim 1 further comprising fixing the probes in a vertical position in the probe retention assembly.

* * * * *